United States Patent [19]

Ichihara et al.

[11] Patent Number: 5,355,101

[45] Date of Patent: Oct. 11, 1994

[54] QUADRATURE MODULATOR HAVING CIRCIUT FOR CORRECTING PHASE ERROR

[75] Inventors: Masaki Ichihara; Tsuguo Maru, both of Tokyo, Japan

[73] Assignee: Nec Corporation, Tokyo, Japan

[21] Appl. No.: 973,762

[22] Filed: Nov. 9, 1992

[30] Foreign Application Priority Data

Nov. 8, 1991 [JP] Japan .................................. 3-321219

[51] Int. Cl.$^5$ .......................... H03C 3/40; H04L 27/20
[52] U.S. Cl. .................................... 332/103; 332/123;
332/144; 375/39; 375/57; 375/60; 375/67;
455/63; 455/110
[58] Field of Search ................ 332/103, 104, 105, 123,
332/159, 144, 146, 147, 148; 375/39, 57, 58, 60,
67; 455/63, 110

[56] References Cited

U.S. PATENT DOCUMENTS 4,890,301 12/1989 Hedberg ..................... 332/123 X
5,111,155 5/1992 Kente et al. .................. 375/57 X

FOREIGN PATENT DOCUMENTS

0318444 5/1989 European Pat. Off. .
0324897 7/1989 European Pat. Off. .
3-50445 3/1983 Japan .

Primary Examiner—Siegfried H. Grimm
Attorney, Agent, or Firm—Sughrue, Mion, Zinn, Macpeak & Seas

[57] ABSTRACT

A quadrature modulator substantially completely compensating a phase error existing between two quadrature carriers by calculating two corrected baseband signals. One corrected baseband signal is generated by adding a common phase component signal and an orthogonal phase component signal after multiplying the common phase component signal and the orthogonal component signal by a first factor a and a second factor b respectively. The other corrected baseband signal is generated by adding the orthogonal phase component signal and the common phase component signal after multiplying the orthogonal component signal and the common phase component signal by the first factor a and the second factor b respectively. The output signal Z of the quadrature modulator is generated by adding both the outputs X and Y of first and second modulating circuits each modulating a respective carrier by a respective corrected baseband signal. If the phase error is $\alpha$, the phase error is compensated by adopting the multiplying factors, for example, $a = \cos(\alpha/2)$ and $b = \sin(\alpha/2)$. In this case, output signal Z is expressed as $Z = \cos\alpha \cdot \cos(\omega t + \phi(t) + \alpha/2)$, which is free from an image signal.

4 Claims, 6 Drawing Sheets

QUADRATURE MODULATOR HAVING CIRCIUT FOR CORRECTING PHASE ERROR

BACKGROUND OF THE INVENTION

The present invention relates to a quadrature modulator for implementing angle modulation, and more particularly, to a quadrature modulator having a function for correcting a phase error caused by a phase shift device.

PRIOR ART

Figure 1:
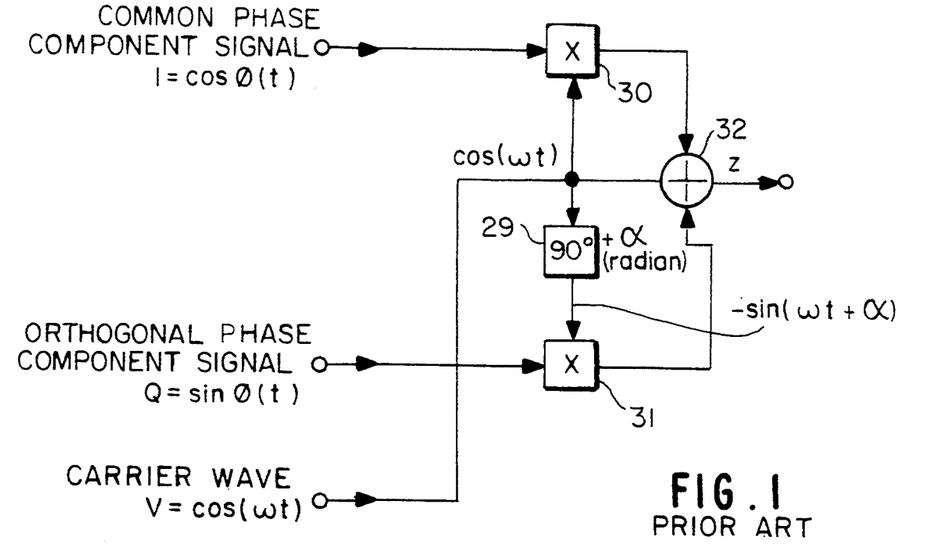
FIG. 1 is a block diagram showing a conventional quadrature modulator.

A conventional quadrature modulator will be explained with reference to the drawings. FIG. 1 shows an example of a typical conventional quadrature modulator, in which a modulated output wave Z is expressed as:

$$Z = \cos(\omega t + \phi(t)) \qquad (1)$$

wherein $\omega$ is an angular frequency of quadrature carriers and $\phi(t)$ is a phase information to be superimposed. The amplitude of the modulated wave is set at unity in Equation (1), since it is not of concern in this case. The quadrature modulator generates this waveform by adding two quadrature carriers after multiplying the two carriers by a suitable weighting factor respectively.

To generate the waveform of Equation (1), two component signals are generated, one of which is called a common phase component signal I expressed as $$I = \cos \phi(t)$$

and the other of which is called an orthogonal phase component signal Q expressed as $$Q = \sin \phi(t).$$

The two component signals are inputted through input terminal to multipliers 30 and 31 respectively. On the other hand, carrier wave $\cos(\omega t)$ is inputted through a carrier input terminal, via which the carrier wave is supplied to the multiplier 30 directly and to the multiplier 31 through a phase shift device 29 in which the carrier wave is phase-shifted by 90° in the leading direction to form a second carrier wave $$\cos(\omega t + \pi/2) = -\sin \omega t.$$

The output signal Z, which is generated in an adder 32 by adding the outputs of both the multipliers 30 and 31, is expressed as $$\begin{aligned} Z &= I \cdot \cos(\omega t) - Q \cdot \sin(\omega t) \\ &= \cos\phi(t) \cdot \cos(\omega t) - \sin\phi(t) \cdot \sin(\omega t) \\ &= \cos(\omega t + \phi(t)) \end{aligned} \qquad (2)$$

Equation (2) is the same as Equation (1), which means that the circuit shown in FIG. 1 can act as an angle modulator.

The above described principle is valid only when the phase shift angle implemented by the phase shift device 29 is exactly 90°. In a practical circuit, however, a phase shift error usually occurs due to the difference of manufacturing process or arrangement of the circuit components. Assuming that the error is $\alpha$ radian as shown in FIG. 1, which means that the phase shift angle implemented by the phase shift device 29 equals $\pi/2 + \alpha$ radian, the equation (2) becomes $$\begin{aligned} Z &= \cos\phi(t) \cdot \cos(\omega t) - \sin\phi(t) \cdot \sin(\omega t + \alpha) \\ &= \cos\phi(t) \cdot \cos(\omega t + \alpha/2 - \alpha/2) - \\ &\quad \sin\phi(t) \cdot \sin(\omega t + \alpha/2 + \alpha/2) \\ &= \cos\phi(t) \cdot \cos(\omega t + \alpha/2) \cdot \cos(\alpha/2) + \\ &\quad \cos\phi(t) \cdot \sin(\omega t + \alpha/2) \cdot \sin(\alpha/2) - \\ &\quad \sin\phi(t) \cdot \sin(\omega t + \alpha/2) \cdot \cos(\alpha/2) - \\ &\quad \sin\phi(t) \cdot \cos(\omega t + \alpha/2) \cdot \sin(\alpha/2) \\ &= \cos(\alpha/2) \cdot \cos(\omega t + \phi(t) + \alpha/2) + \\ &\quad \sin(\alpha/2) \cdot \sin(\omega t - \phi(t) + \alpha/2) \end{aligned} \qquad (3)$$

Although the first term in Equation (3) is different in phase by $\alpha/2$ and in amplitude by $\cos(\alpha/2)$ from the signal Z as appears in the right-hand side of Equation (2), it is equal in frequency to the output signal Z, so that the first term can be considered one of the signal components. On the other hand, the second term, the angular frequency of which is in symmetry to that of the signal component with respect to the angular frequency $\omega$ of the carrier, is a spurious component called an image signal. The image signal itself is an unnecessary component and acts as a perturbing wave for a communication.

The ratio of the amplitude of the first term to the amplitude of the second term is called suppression factor S/I and expressed as $$\begin{aligned} S/I &= \cos(\alpha/2)/\sin(\alpha/2) \\ &= 1/\tan(\alpha/2) \end{aligned} \qquad (4)$$

According to Equation (4), even a slight phase error $\alpha = 1°$ results in a considerable degradation to 41 dB in image suppression factor, giving a considerable disturbance to the communication.

The phase error can scarcely be avoided in a practical circuit due to the difference in layout or wire-length in ICs in which many circuits each having a configuration such as shown in FIG. 1 are integrated. It is necessary in a quadrature modulator, therefore, to correct the phase error caused by the phase shift device.

The conventional methods for correcting the phase error include deleting the phase error per se and deleting or compensating the effect of the phase error by adding a correcting signal to the baseband signal.

In the first correcting method, one of the carrier waves for the signals I and Q is inputted to a phase lag circuit in which the phase delay is adjusted from outside.

Figure 2:
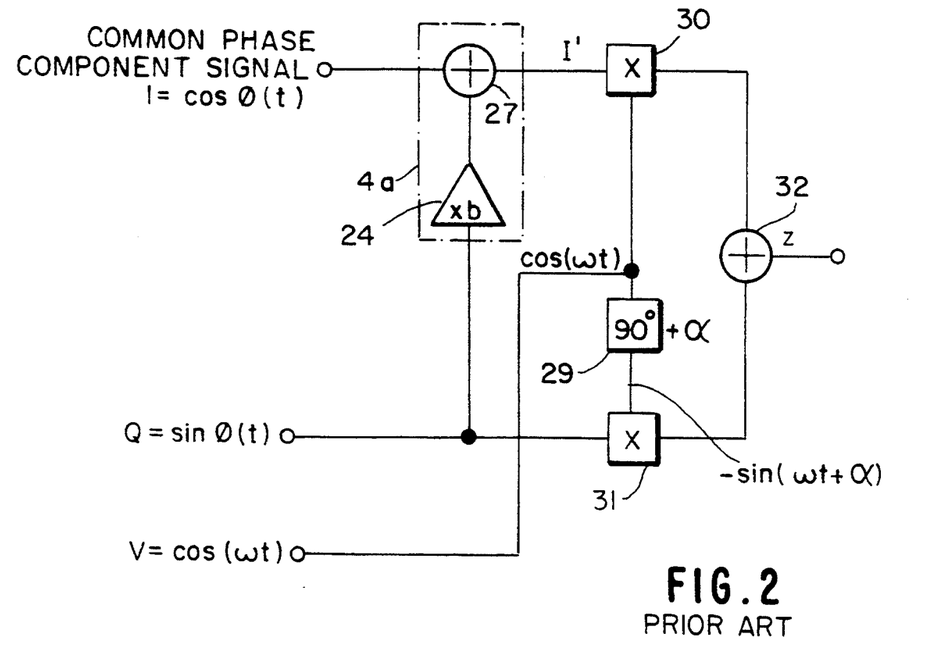
FIG. 2 is a block diagram showing another conventional quadrature modulator.

The second correcting method is implemented by a circuit shown in FIG. 2 and described in a Japanese Patent Kokoku (After-examination) Publication No. Hei-3-50445. The conventional circuit shown in FIG. 2 is constituted by adding a level adjusting circuit 4a to the circuit of FIG. 1. In this level adjusting circuit, the orthogonal phase component signal Q is multiplied by a multiplying factor b in a multiplier 24, then added to the common phase signal component in an adder 27 for generating a corrected common phase component signal I'.

When a phase error caused by the phase shift device 29 is assumed $\alpha$, the output signal Z is expressed as $$Z = (\cos\phi(t) + b \cdot \sin\phi(t)) \cdot \cos\phi(t) - \sin\phi(t) \cdot \sin(\omega t + \alpha).$$

Now, if the multiplying factor b is assumed $\sin \alpha$, the output Z becomes $$Z = \cos\phi(t) \cdot \cos(\omega t) + \sin\alpha \cdot \sin\phi(t) \cdot \cos(\omega t) - \\ \sin\phi(t) \cdot \sin(\omega t) \cdot \cos(\alpha) - \sin\phi(t) \cdot \cos(\omega t) \cdot \sin\alpha \\ = \cos\phi(t) \cdot \cos(\omega t) - \sin\phi(t) \cdot \sin(\omega t) \cdot \cos\alpha \\ = \cos(\omega t + \phi(t)) + (1 - \cos\alpha) \cdot \sin\phi(t)\sin(\omega t)$$ (5)

If $\alpha$ is very small, then $1 - \cos\alpha \approx 0$ and therefore the output signal Z is approximated as follows:

$$Z \approx \cos(\omega t + \phi(t))$$ (6)

Consequently, an unnecessary wave caused by the phase error can be suppressed by a considerable amount through adopting a multiplier having a multiplying factor b equal to sin $\alpha$.

In an automobile telephone or movable telephone which is developed remarkably in recent years, easy adjustment and high throughput is especially required. With the conventional quadrature modulator implementing the first method, however, an extremely fine adjustment is necessary to correct the phase error, thus it does not satisfy the requirement for an easy adjustment and yet it is too expensive.

With the conventional circuit implementing the second method, although the adjustment for correcting the phase error is easy to achieve, it has following disadvantages:

(1) Equation (6) is valid only when the phase error $\alpha$ is very small. If $\alpha$ becomes, for example, 10° then the second term is not negligible as compared to the first term in Equation (6), since the level of the first term is suppressed only by 36 dB of the level of the first term. In the region of high frequency, e.g. microwave region, the phase error becomes often more than 10°, so that the amount of the suppression by this method is not enough.

(2) A balance between the two component signals is lost, since the leveling of the baseband signal by the level adjusting circuit is applied only to the common phase component signal. Especially a time lag caused by the adder 27 results in a distortion of the output signal.

In addition, the phase error depends on the ambient temperature since ICs including the quadrature modulators are composed of semiconductors the characteristics of which are considerably affected by a temperature fluctuation. The two conventional quadrature modulators do not comprise any means for compensating a phase error caused by a temperature fluctuation. Consequently, there occurs a considerable amount of a phase error in the conventional quadrature modulators adjusted under the room temperature, if it is operated outdoors where the ambient temperature is different from the room temperature.

SUMMARY OF THE INVENTION

An object of the invention is to provide a quadrature modulator in which a phase error is corrected by a considerable amount even when the phase error is not very small.

Another object of the invention is to provide a quadrature modulator in which distortion of an output of the quadrature modulator is considerably reduced by balancing first and second modulating signals.

According to the invention there is provided a quadrature modulator which corrects a phase shift error from 90° existing between first and second carriers by way of adding means and multiplying means, said first and second carriers being transmitted by transmitting means, i.e. wiring, to a first and a second modulating means. Adding means adds first and second input signals after multiplying each of the first and second input signals by first and second factors for generating first modulating signal.

The multiplying means multiplies the second input signal by a third factor for generating a second modulating signal. The first and the second modulating means each modulates one of the carriers by the respective modulating signal for generating a first and a second modulated signal. The first and the second modulated signals are then added together and outputted from the quadrature modulator. At least two of the first, second and third factors are corrected in accordance with the phase error. Thus the phase error in the output signal can be deleted in this correction of the multiplying factors. In addition, both the time lags in the modulating signals caused by adding means and multiplying means can be compensated by each other.

The multiplying means may be replaced by a second adding means similar to the first adding means. In this case, the first input signal is multiplied by the second factor and the second input signal is multiplied by the first factor in the second adding means, then both the signals are added together. In this case, one of the first and the second factors may be 1. Further in this case, both the adding means may have the same configuration.

Each of the adding means and the multiplying means is constituted preferably by an operational amplifier in which input impedance of the operational amplifier is selected among plural impedance elements for correcting multiplying factors.

The data of the phase error may be stored during an adjustment procedure in a non-volatile memory disposed within the quadrature modulator. The data of the phase error may be read by CPU immediately after the quadrature modulator is powered. The adjustment means may be included within the quadrature modulator.

Preferably temperature dependency of the phase error is cancelled by the correcting means. In this case ambient temperature may be detected by a thermal detector disposed within the quadrature modulator.

BRIEF EXPLANATION OF THE DRAWINGS

These and further objects, features and advantages of the invention will be apparent from the following description of preferred embodiments with reference to the drawings, in which.

DETAILED DESCRIPTION OF THE PREFERRED EMBODIMENTS

Figure 3:
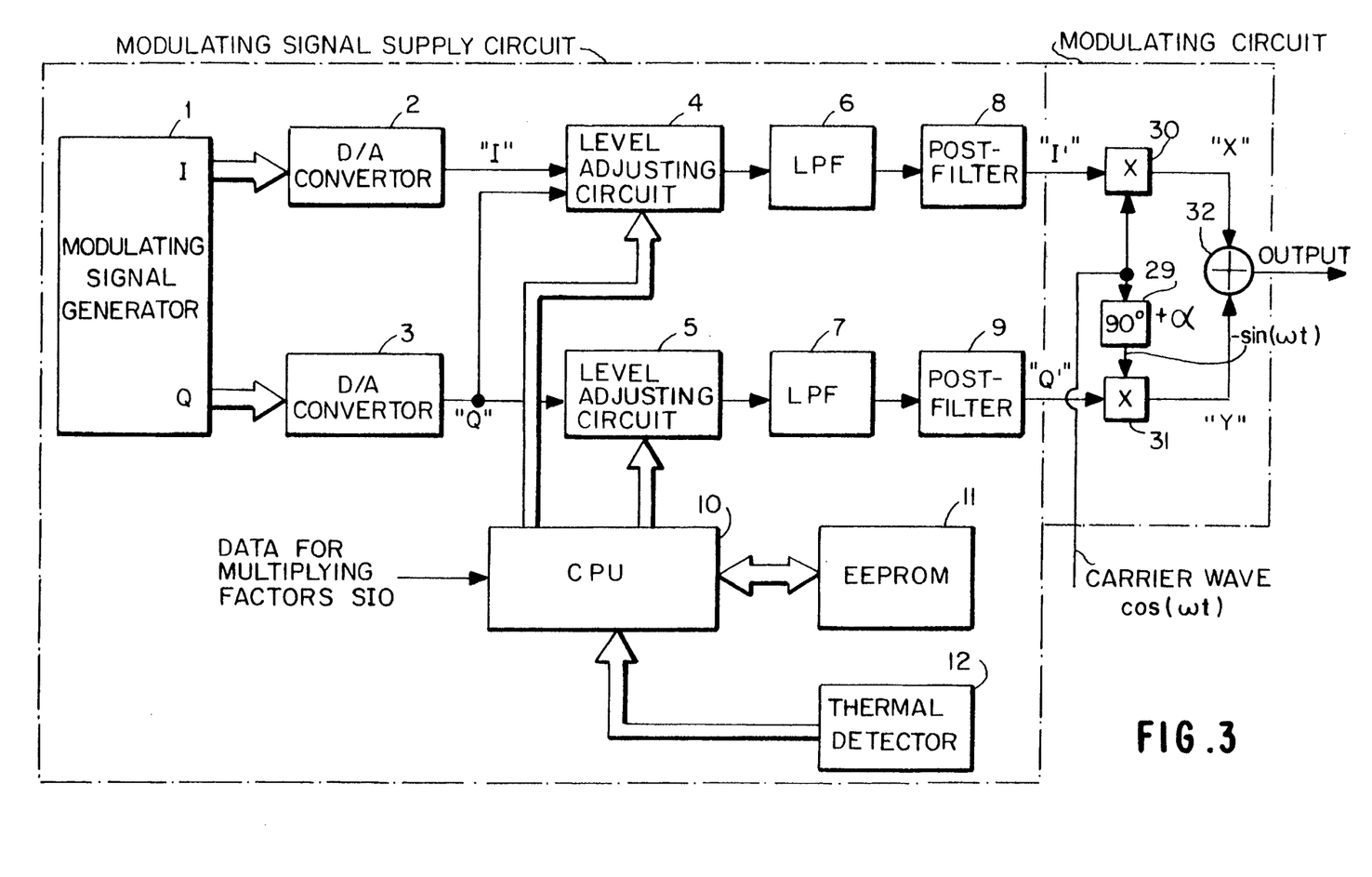
FIG. 3 is a block diagram showing an embodiment of a quadrature modulator according to the invention.

Now, the present invention will be described in more detail with reference to the drawings. FIG. 3 shows a block diagram of a quadrature modulator according to the invention. In FIG. 3 the quadrature modulator comprises a modulating circuit having multipliers 30 and 31, a phase shift device 29 and an adder 32 all of which are similar to those described in the conventional quadrature modulator. The quadrature modulator further comprises a modulating signal supply circuit having a modulating signal generator 1 generating a digital modulating signal, D/A converters 2 and 3 each output of which is updated in accordance with a sample frequency, level adjusting circuits 4 and 5, low-pass-filters 6 and 7 for suppressing a spurious signal composed of quantization noises, postfilters 8 and 9 for suppressing a spurious signal caused by sampling, a central processing unit (CPU) 10, an EEPROM 11, and a thermal detector 12.

The output signals I' and Q' of the modulating signal supply circuit are supplied from the post filters 8 and 9 to the multipliers 30 and 31 respectively in which quadrature carriers cos ($\omega t$) and $-\sin$ ($\omega t$) are modulated by the two signals I' and Q' in such a way as described in the conventional quadrature modulator. The two modulated signals are then added in the adder 32 and outputted from an output terminal.

CPU 10 receives via serial interface SIO during an adjusting procedure data for multiplying factors of the level adjusting circuits 4 and 5, then writes the data to EEPROM 11. When the power source is applied to the quadrature modulator, CPU 10 first reads the data stored in EEPROM 11, then corrects the data for multiplying factor to be supplied to the multipliers disposed in the level adjusting circuits 4 and 5 in accordance with a temperature information received from the thermal detector 12. The corrected data is supplied to the level adjusting circuits for setting the multiplying factors of the multipliers disposed in the level adjusting circuits 4 and 5.

In FIG. 3 the level adjusting circuit 4 multiplies the common phase component signal I by a first factor A and orthogonal phase component signal Q by a second factor B, then adds both the multiplied component signals. The sum is outputted as its output signal called a corrected common phase component signal I' through the low-pass-filter 6 and postfilter 8. On the other hand, the level adjusting circuit 5 multiplies the orthogonal phase component signal Q by a third factor C and outputs through the low-pass-filter 7 and postfilter 9 the product as its output signal called a corrected orthogonal phase component signal Q'.

Accordingly, the modulated common phase signal X and the modulated orthogonal phase signal Y, each of which is a product of one of the corrected component signals and the respective carrier, are expressed as follows:

$$X = I' \cdot \cos(\omega t)$$
$$= A\cos\phi(t) \cdot \cos(\omega t) + B\sin\phi(t) \cdot \cos(\omega t)$$

-continued
$$Y = -Q' \cdot \sin(\omega t + \alpha)$$
$$= -C\sin\phi(t) \cdot \sin(\omega t) \cdot \cos\alpha - C\sin\phi(t) \cdot \cos(\omega t) \cdot \sin\alpha$$

wherein $\alpha$ is a phase error caused by the phase shift device 29. Therefore, the output signal Z generated by adding the two modulated signals is:

$$Z = X + Y \quad (7)$$
$$= \cos(\omega t)\{A\cos\phi(t) + B\sin\phi(t) - C\sin\phi(t)\sin\alpha\} -$$
$$\sin(\omega t) \cdot C\sin\phi(t) \cdot \cos\alpha$$

Now, if it is assumed that A=1, B=tan $\alpha$, and C=1/cos $\alpha$, then Equation (7) becomes $$Z = \cos(\omega t) \cdot \cos\phi(t) - \sin(\omega t) \cdot \sin\phi(t) \quad (8)$$
$$= \cos(\omega t + \phi(t))$$

Equation (8) is the same as Equation (1), so that the phase error is substantially completely compensated regardless of its amount. Alternatively, if it is assumed that C=1, A=cos $\alpha$ and B=sin $\alpha$ then Equation (7) becomes $$Z = \cos(\omega t) \cdot \cos\alpha \cdot \cos\phi(t) - \sin(\omega t) \cdot \sin\phi(t) \cdot \cos\alpha$$
$$= \cos\alpha \cdot \cos(\omega t + \phi(t))$$

Again in this case, a spurious signal is completely eliminated, although there is a certain reduction in amplitude. Further, if it is assumed that B=1, A=1/ tan $\alpha$ and C=1/ sin $\alpha$ then Equation (7) becomes $$Z = \cos(\omega t) \cdot (1/\tan\alpha) \cdot \cos\phi(t) -$$
$$\sin(\omega t) \cdot (1/\sin\alpha) \cdot \sin\phi(t) \cdot \cos\alpha$$
$$= (1/\tan\alpha) \cdot \cos(\omega t + \phi(t)$$

Further in this case, a spurious signal is eliminated, although the amplitude is unstable due to small $\alpha$.

As described above, when a suitable combination of the values for three multiplying factors A, B and C is selected, output signal Z can be free from an image signal or at least reduced by a considerable amount. If one of the three multiplying factors is selected as 1, the circuit of the level adjusting circuits can be simplified.

Figure 4:
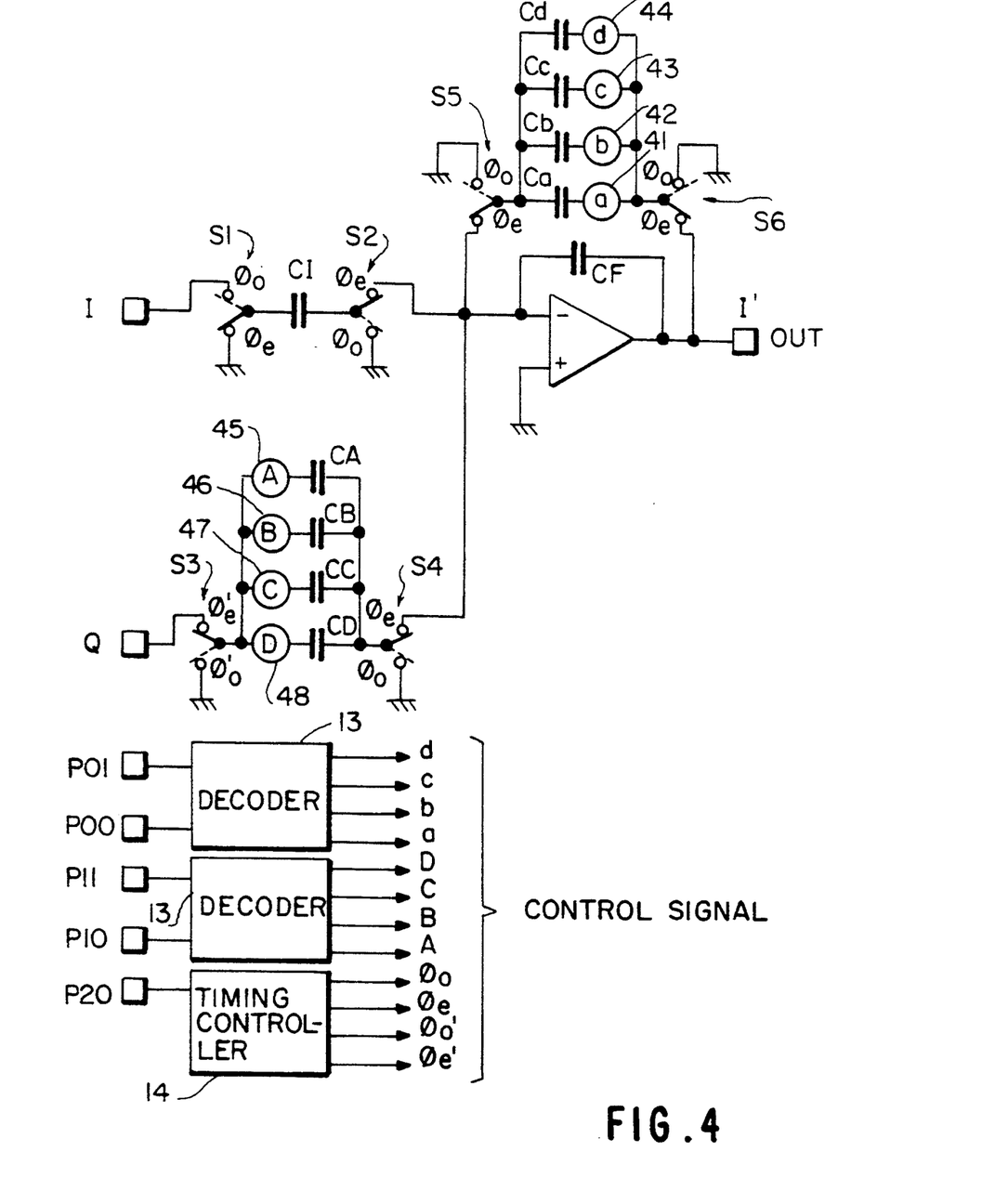
FIGS. 4 and 4A each shows a circuit diagram of the level adjusting circuit in the embodiment of FIG. 3.

FIG. 4 shows an example of a circuit arrangement of the level adjusting circuit 4. The level adjusting circuit 4 comprises decoders 13, a timing controller 14, capacitors Ca-Cd, $C_A$-$C_D$ and $C_I$, analog switches 41–44 controlled by control signals $P_{00}$ and $P_{01}$ constituting a set of 2 bit signal, and analog switches 45–48 controlled by control signals $P_{10}$ and $P_{11}$ constituting another set of 2 bit signal.

In order to set the first factor A to a suitable value, one of the switches 41–44 is closed by setting the control signals $P_{10}$ and $P_{11}$. Likewise, the second factor B is set to a suitable value by setting the control signals $P_{10}$ and $P_{11}$ for closing one of the analog switches 45–48. Through these selections, the first factor A is determined by a combination of the capacitor C1 and one of the capacitors $C_a$—$C_d$, while the second factor B is determined by a combination of one of the capacitors $C_a$—$C_d$ and one of the capacitors $C_A$-$C_D$.

Timing controller 14 controls timing control signals for the changeover switches $S_1$-$S_6$ in such a way that $\phi_o'=\phi_o$ and $\phi_e'=\phi_e$ when signal $P_{20}$ is set at 1, and $\phi_o'=\phi_e$ and $\phi_e'=\phi_o$ when signal $P_{20}$ is set at 0. In this way the quadrature modulator of the embodiment is capable of dealing with either positive or negative phase error by controlling the switches through setting the bit $P_{20}$. The level adjusting circuit 4 subtracts the multiplied value of the signal Q from the multiplied value of the signal I when $P_{20}$ is 1 and adds the multiplied value of the two signals I and Q when signal $P_{20}$ is 0.

Figure 4A:
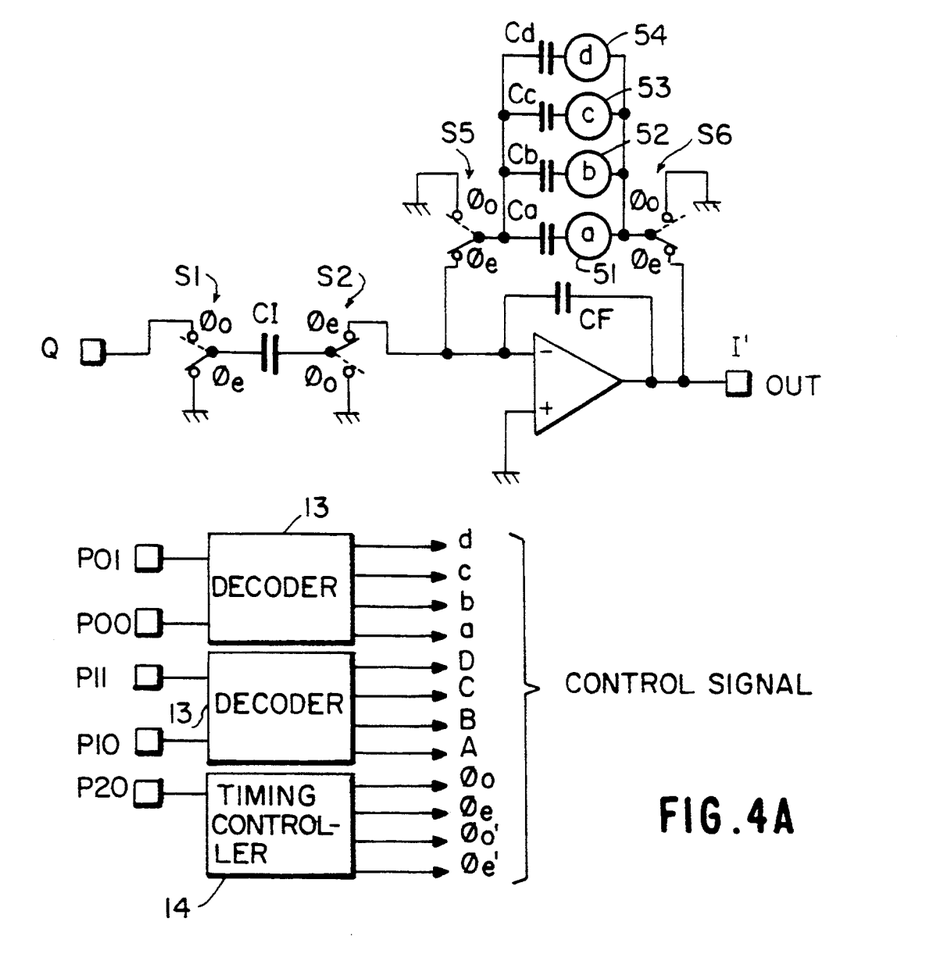

The configuration of the level adjusting circuit 5 is shown in FIG. 4A. The level adjusting circuit 5 is the same as the level adjusting circuit 4 shown in FIG. 4 with the exception that the level adjusting circuit 5 does not comprises the group of of the switches 45-48, the capacitors $C_A$-$C_D$ and the changeover switches $S_3$ and $S_4$ as shown in FIG. 4.

With the quadrature modulator according to the embodiment of the invention, a phase error is substantially completely compensated and yet the balance between the two component signals is not lost since both the level adjusting circuits for dealing with the common phase and orthogonal phase component signals are similar to each other in the configuration.

Figure 5:
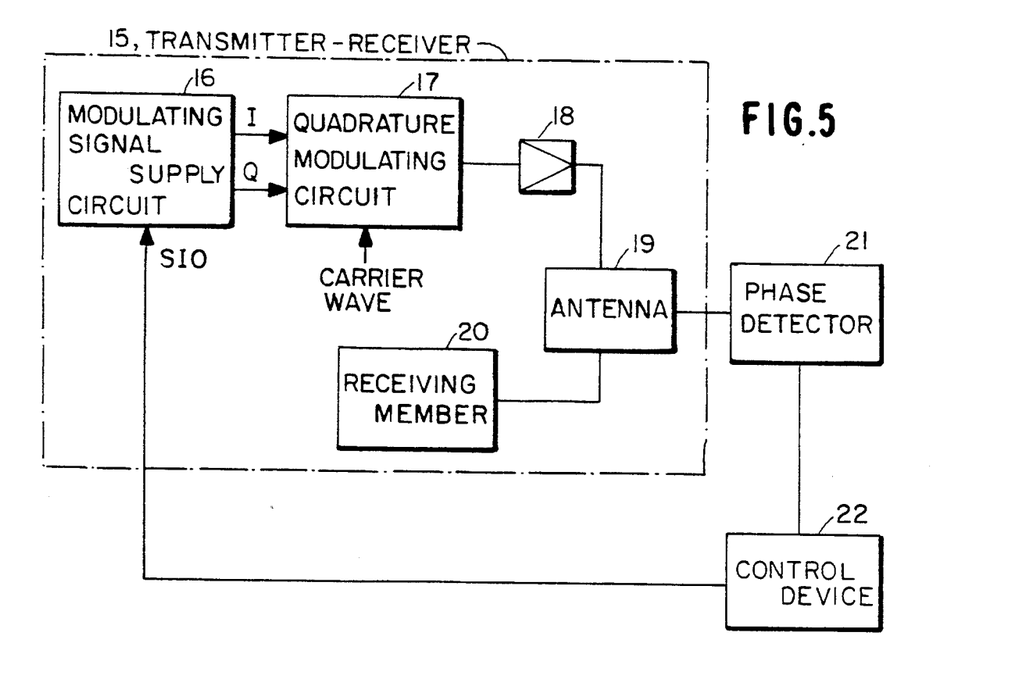
FIG. 5 is a block diagram showing an adjustment procedure for the embodiment of FIG. 3.

FIG. 5 shows a block diagram showing an arrangement during an adjustment procedure for a transmitter-receiver including a quadrature modulator according to the embodiment. The transmitter-receiver 15 comprises modulating signal supply circuit 16, the arrangement of which is shown in FIG. 3, a quadrature modulating circuit 17 constituting a quadrature modulator of FIG. 3 in combination with the modulating signal supply circuit 16, a power amplifier 18, an antenna 19 for trasmitting and receiving signals and a receiving member 20.

As shown in FIG. 5, the adjustment is carried out by a phase detector 21 connected to the antenna 19 and a control device 22. The phase detector 21 detects both the common phase component signal and the orthogonal phase component signal from the output of the transmitter-receiver 15 and measures the phase error $\alpha$ caused by a phase shift device. The phase error $\alpha$ is then inputted to the control device 22 in which each multiplying factor for the level adjusting circuits 4 and 5 is calculated. The resultant factors are supplied by the control device 22 to CPU 10 (FIG. 3) of the modulating signal supply circuit 16 via the serial interface SIO. The phase detector and/or the control device can be included within the transmitter-receiver.

Figure 6:
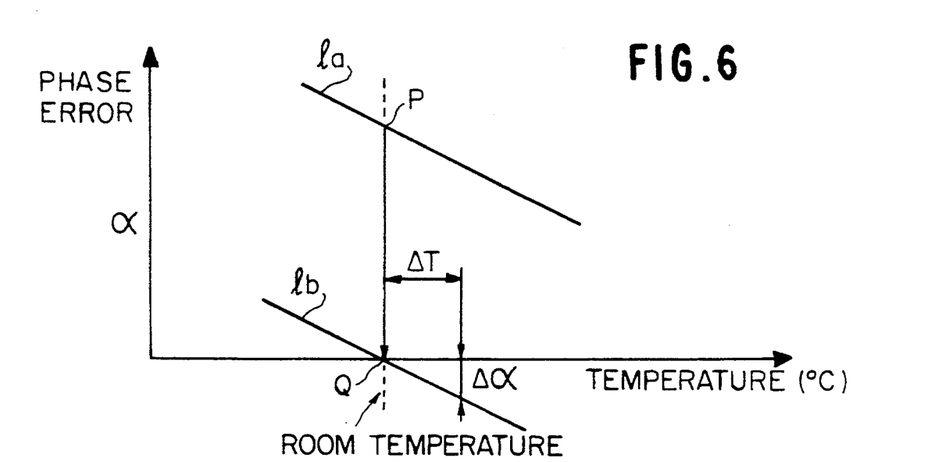
FIG. 6 is a graph showing a temperature characteristic of a phase error in the embodiment of FIG. 3.

Now, the operation for compensating a temperature fluctuation is explained with reference to FIG. 6. The temperature dependency in characteristics per se of semiconductors constituting the quadrature modulator causes temperature dependency of the phase error $\alpha$. The phase error $\alpha$ varies along a line $1_a$ in FIG. 6 and stays, for example, at a point P under a room temperature. After the adjustment for correcting the phase error is performed at the room temperature, the phase error $\alpha$ is set to 0 at another point Q. The temperature dependency of the phase error $\alpha$, however, still remains, so that the phase error $\alpha$ moves along another line $1_b$ with a temperature fluctuation. Consequently, a phase error $\Delta\alpha$ occurs when the ambient temperature rises from the room temperature by $\Delta T$.

The transmitter-receiver comprises the thermal detector 12 within the modulating signal supply circuit 16 as described above and shown in FIG. 3. When the power is supplied to the transmitter-receiver, CPU 10 reads out the data from EEPROM 11 for setting multiplying factors of the multipliers 4 and 5. The data readout from the EEPROM 11 is set under the room temperature at Q, hence CPU 10 corrects the data in accordance with the present temperature inputted from the thermal detector 12. CPU 10 then supplies the corrected data to the level adjusting circuits 4 and 5, thus deleting a phase error caused by a temperature fluctuation for deleting a spurious component.

Figure 7:
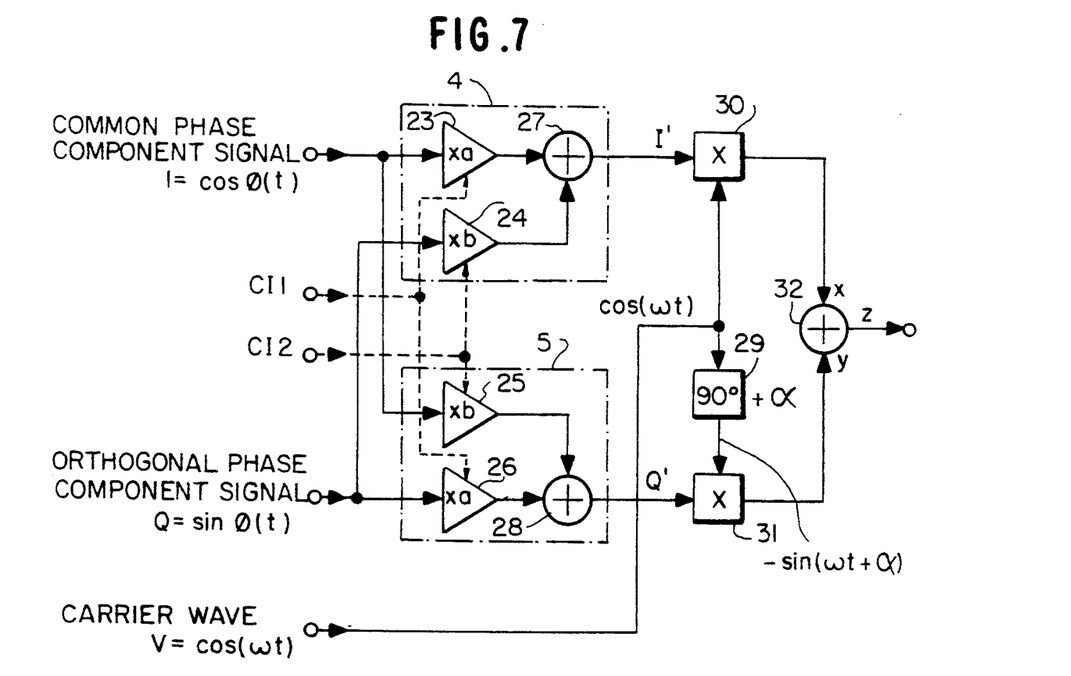
FIG. 7 is a block diagram showing another embodiment of a quadrature modulator according to the invention.

FIG. 7 shows a block diagram of a quadrature modulator according to another embodiment of the invention. With this embodiment, the level adjusting circuits 4 and 5 each comprises two multipliers 23 and 24; 25 and 26, and an adder 27; 28. The common phase component signal I is multiplied by a first factor a in a multiplier 23 and the orthogonal phase component signal Q is multiplied by a second factor b in a constant multiplier 24, then the two multiplied signals are added together in an adder 27 for generating a corrected common phase component signal I'.

Likewise, the orthogonal phase component signal Q is multiplied by the first factor a in a multiplier 26 and the common phase component signal I is multiplied by the second factor b in a multiplier 25, then the two multiplied signals are added together in an adder 28 for generating a corrected orthogonal phase component signal Q'. Each of the corrected component signals I' and Q' is respectively inputted to a multiplier 30 and 31 as well as the respective carriers cos ($\omega t$) and $-\sin(\omega t+\alpha)$.

Now, if it is assumed that the first and the second factors a and b are expressed in term of the phase error $\alpha$ as follows:

$$a = \cos(\alpha/2)$$

$$b = \sin(\alpha/2)$$

then the corrected component signals I' and Q' are expressed as $$\begin{aligned} I' &= \cos\phi(t) \cdot \cos(\alpha/2) + \sin\phi(t) \cdot \sin(\alpha/2) \\ &= \cos(\phi(t) - \alpha/2) \end{aligned}$$

$$\begin{aligned} Q' &= \sin\phi(t) \cdot \cos(\alpha/2) + \cos\phi(t) \cdot \sin(\alpha/2) \\ &= \sin(\phi(t) + \alpha/2). \end{aligned}$$

Consequently, the modulated waves X and Y each outputted from the multipliers 30 and 31 are expressed as $$X = \cos(\phi(t)+\alpha/2-\alpha)\cdot\cos(\omega t)$$

$$Y = -\sin(\phi(t)+\alpha/2)\cdot\sin(\omega t+\alpha).$$

The output Z of the quadrature modulator, which is generated in the adder 32 by adding the two modulated waves X and Y, is then expressed as $$Z = X + Y \qquad (9)$$
$$= \cos(\phi(t) + \alpha/2) \cdot \cos\alpha \cdot \cos(\omega t) +$$
$$\sin(\phi(t) + \alpha/2) \cdot \sin\alpha \cdot \cos(\omega t) -$$
$$\sin(\phi(t) + \alpha/2) \cdot \sin(\omega t) \cdot \cos\alpha -$$
$$\sin(\phi(t) + \alpha/2) \cdot \cos(\omega t) \cdot \sin\alpha$$
$$= \cos\alpha \cdot \cos(\omega t + \phi(t) + \alpha/2)$$

Although the output signal Z in Equation (9) includes a certain reduction in amplitude by a factor cos α and a certain phase shift by α/2 as compared to the output signal Z expressed in Equation (1), there is only a signal frequency component present and an image signal is completely eliminated in Equation (9). In addition, the balance of both the corrected component signals is improved over the first embodiment because the configurations of the level adjusting circuits are similar to each other.

Figure 8:
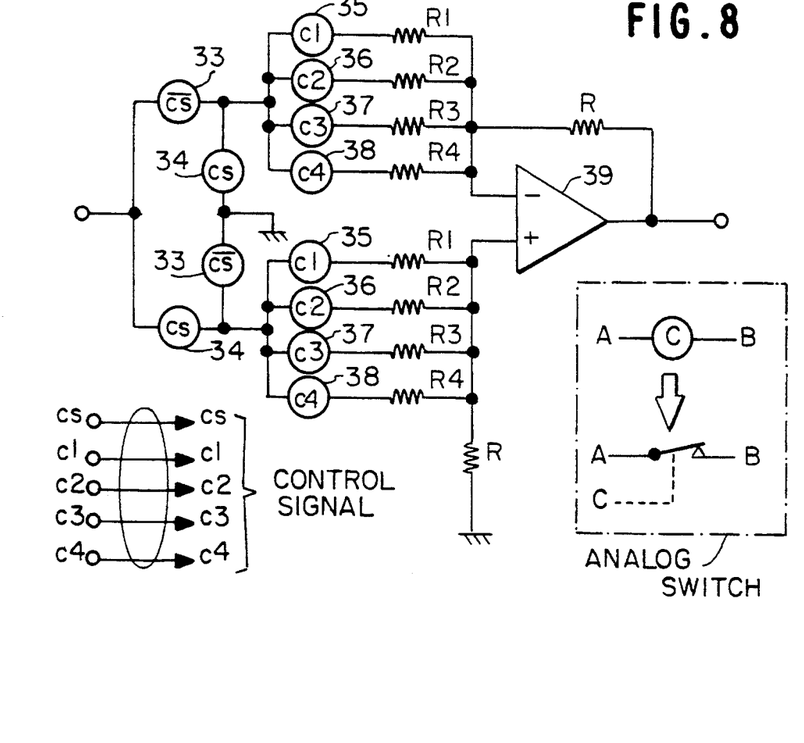
FIG. 8 is a circuit diagram of a multiplier in the embodiment of FIG. 7.

FIG. 8 shows a practical configuration of each of the multipliers 23-26 comprising an operational amplifier 39, in which analog switches 35-38 are controlled by control signals c1-c4 and cs for selecting resistors R1-R4. When the control signal c1 is 1, switch 35 closes. Each of the analog switches 35-38 closes when the respective control signals c1-c4 are set at 1. An analog switch 34 closes when the signal cs is 1 and opens when the signal cs is 0, while analog switch 33 closes when the signal cs is 0 and opens when the signal cs is 1.

When, for example, the control signal c1 is set at 1 the switch 35 closes for selecting the resistor R1, thus the factor of an operational amplifier 39 is determined as R/R1. The operational amplifier 39 becomes an non-inverting amplifier when signal cs is 1 and becomes an inverting amplifier when the signal cs is 0. Consequently, the factor $F_c$ of the operational amplifier 39 is expressed as $$F_c = (-1)^s \cdot R/Ri \quad (i = 1,2,3,4:\ s\ \text{is equal to}\ cs)$$

As shown in the above equation, the factor $F_c$ becomes either a positive or a negative value responsive to the control signal cs. Those control signals c1-c4 and cs are supplied from CPU to the multipliers via control terminals $CI_1$ and $CI_2$ as shown in FIG. 7.

In the second embodiment one of the multiplying factors a and b may be equal to 1. If the multiplying factors are selected as a=1 and b=tan (2/α), then $$I' = \cos\phi(t) + \sin\phi(t) \cdot \tan(\alpha/2)$$
$$= (1/\cos(\alpha/2)) \cdot (\cos\phi(t) \cdot \cos(\alpha/2) + \sin\phi(t) \cdot \sin(\alpha/2))$$
$$= (1/\cos(\alpha/2)) \cdot \cos(\phi(t) - \alpha/2))$$

$$Q' = \sin\phi(t) + \cos\phi(t) \cdot \tan(\alpha/2)$$
$$= (1/\cos(\alpha/2)) \cdot ((\sin\phi(t) \cdot \cos(\alpha/2) + \cos\phi(t) \cdot \sin(\alpha/2))$$
$$= (1/\cos(\alpha/2)) \cdot \sin(\phi(t) + \alpha/2))$$

$$X = (1/\cos(\alpha/2)) \cdot \cos(\phi(t) + \alpha/2 - \alpha) \cdot \cos(\omega t)$$
$$Y = -(1/\cos(\alpha/2)) \cdot \sin(\phi(t) + \alpha/2) \cdot \sin(\omega t + \alpha).$$

Consequently, the output signal Z becomes $$Z = X + Y$$
$$= (1/\cos(\alpha/2)) \cdot \{\cos(\phi(t) + \alpha/2) \cdot \cos\alpha \cdot \cos(\omega t) + \sin(\phi(t) + \alpha/2) \cdot \sin\alpha \cdot \cos(\omega t) - \sin(\phi(t) + \alpha/2) \cdot \sin(\omega t) \cdot \cos\alpha -$$

-continued
$$\sin(\phi(t) + \alpha/2) \cdot \cos(\omega t) \cdot \sin\alpha$$
$$= (\cos\alpha/\cos(\alpha/2)) \cdot \cos(\omega t + \phi(t) + \alpha/2)$$

Therefore, the output signal Z is free from an image signal. Likewise, if the multiplying factors are selected as a=1/tan α and b=1, the output signal Z is expressed as follows:

$$Z = (\cos\alpha/\sin(\alpha/2)) \cdot \cos(\omega t + \Phi(t) + \alpha/2).$$

This equation shows that Z is also free from an image signal, although the amplitude is unstable. When one of the multiplying factors a and b is selected as 1, the configuration of one of the multipliers in the level adjusting circuit can be simplified.

Figure 9:
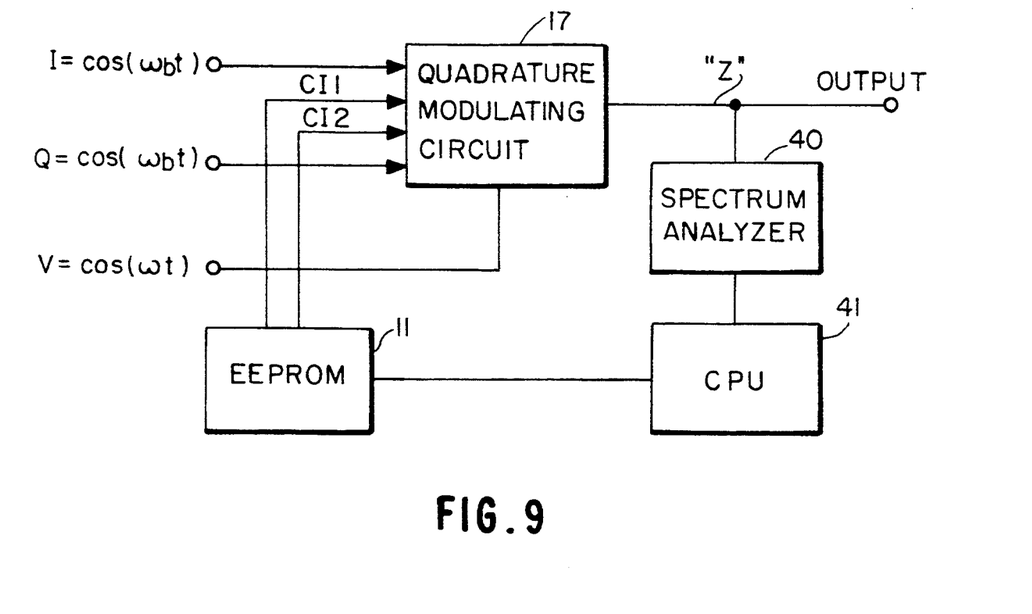
FIG. 9 is a block diagram showing an adjustment procedure for the embodiment of FIG. 7.

FIG. 9 is a block diagram showing an example of an adjustment for correcting a phase error in the quadrature modulating circuit 17 of the second embodiment. The output Z of the quadrature modulating circuit 17, the arrangement of which is shown in FIG. 7, is inspected by a spectrum analyzer 40. Assuming that the modulating signals are cos ($\omega_b t$) and sin ($\omega_b t$), only a spectral line appears at an angular frequency $\omega + \omega_b$ if the output signal Z does not include an image signal. On the other hand, if the carriers include a phase error between them, another spectral line appears at an angular frequency $\omega - \omega_b$ in the spectrum due to an image signal.

When the spectrum analyzer 40 detects the spectral line of the image signal, it supplies the level data of the spectral line to a CPU 41, which determines the first and the second factors a and b in accordance with the level data and writes in EEPROM 11 the control signals to be supplied for the multipliers. The control signal is provided to the level adjusting circuit via control terminals $CI_1$ and $CI_2$. The spectrum analyzer may be included within the quadrature modulator of FIG. 7.

With the embodiments described above, the corrected modulating signals I' and Q' are generated from the modulating signals I and Q by level adjusting circuits comprising multipliers. The corrected modulating signals, however, can be generated in CPU calculating in digital format differently from the embodiments.

In addition, the correction of the multiplying factors for compensating a phase error caused by the phase shift device can be executed at any time, although in the above embodiments it is executed at the time when the power is supplied to the modulator. Further, a phase shift device is not necessarily disposed within the quadrature modulator of the invention. In this case, the quadrature carriers are generated outside the quadrature modulator.

Although the present invention is explained with reference to its preferable embodiments, it is not limited to such embodiments and various modifications and alterations can be made without departing from the scope of the invention as apparent to those skilled in the art.

What is claimed is:

1. A quadrature modulator for generating a modulated output signal in response to a first signal and a second signal which has a quadrature phase relationship with said first signal, said modulator comprising a first multiplier receiving said first signal and generating a third signal by multiplying said first signal by a first factor, a second multiplier receiving said second signal and generating a fourth signal by multiplying said second signal by a second factor, a third multiplier receiving said first signal and generating a fifth signal by multiplying said first signal by said second factor, a fourth multiplier receiving said second signal and generating a sixth signal by multiplying said second signal by said first factor, a first adder receiving said third and fourth signals and generating a seventh signal by adding said fourth signal to said third signal in a first polarity, a second adder receiving said fifth and sixth signals and generating an eighth signal by adding said fifth signal to said sixth signal in said first polarity, a fifth multiplier receiving said seventh signal and a carrier wave signal and generating a ninth signal by multiplying said seventh signal and said carrier wave signal, a phase shifter receiving said carrier wave signal and generating a phase-shifted carrier wave signal by shifting a phase of said carrier wave signal by a predetermined value with a phase error, a sixth multiplier receiving said eighth signal and said phase-shifted carrier wave signal and generating a tenth signal by multiplying said eighth signal and said phase-shifted carrier wave signal, and a third adder receiving said ninth and tenth signals and generating said modulated output signal by adding said ninth and said tenth signals, each of said first and second factors having such a value that is relative to said phase error of said phase shifter to thereby keep said modulated output signal free from a spurious component with respect to an angular frequency of said carrier wave signal.

2. The modulator as claimed in claim 1, wherein said first factor is equal to $\cos(\alpha/2)$ and said second factor is equal to $\sin(\alpha/2)$ when said phase error is representative of $\alpha$.

3. The modulator as claimed in claim 1, wherein each of said first, second, third and fourth multipliers comprises an input terminal, an output terminal, an operational amplifier having first and second input nodes and an output node connected to said output terminal, a first resistor connected between said first input node and said output terminal, a second resistor connected between said second input node and a reference potential point, a plurality of first series connection circuits connected in parallel between said first input node and a first circuit node, each of said first series connection circuits including a first switch and a first resistance element connected in series, a plurality of second series connection circuits connected in parallel between said second input node and a second circuit node, each of said second series connection circuits including a second switch and a second resistance element connected in series, a third switch connected between said first circuit node and said input terminal, a fourth switch connected between said second circuit node and said input terminal, a fifth switch connected between said first circuit node and said reference potential point, and a sixth switch connected between said second circuit node and said reference potential point.

4. The modulator as claimed in claim 3, wherein said first to sixth switches are selectively turned on to provide said first and fourth multiplier with said first factor and said second and third multiplier with said second factor.

* * * * *

UNITED STATES PATENT AND TRADEMARK OFFICE
CERTIFICATE OF CORRECTION

PATENT NO. : 5,355,101
DATED     : October 11, 1994
INVENTOR(S) : Masaki Ichihara It is certified that error appears in the above-indentified patent and that said Letters Patent is hereby corrected as shown below:

Title page, item [54] and col. 2, line 1, in the Title, delete "CIRCUIT"--, and insert --CIRCUIT--;

Title page, item [73], Assignee:  delete "Nec", and insert --NEC--;

Column 7, lines 34 and 35, delete "trasmitting", and insert --Transmitting--.

Signed and Sealed this

Twenty-eight Day of March, 1995

Attest:

BRUCE LEHMAN

Attesting Officer  Commissioner of Patents and Trademarks